US012716925B2

(12) United States Patent
Johnston et al.

(10) Patent No.: US 12,716,925 B2
(45) Date of Patent: Aug. 25, 2026

(54) AUTOMATED ELECTRICAL CONNECTOR WEAR MONITORING

(71) Applicant: International Business Machines Corporation, Armonk, NY (US)

(72) Inventors: Shawn Matthew Johnston, Rochester, MN (US); Michael John MacPherson, Elgin, MN (US); Clinton William Erie, Adams, MN (US); Eric J. Campbell, Rochester, MN (US); Steven Charles Erickson, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 474 days.

(21) Appl. No.: 18/361,193

(22) Filed: Jul. 28, 2023

(65) Prior Publication Data

US 2025/0035687 A1 Jan. 30, 2025

(51) Int. Cl.

| | |
|---|---|
| ***G01R 27/08*** | (2006.01) |
| ***G01R 27/20*** | (2006.01) |
| ***G01R 31/12*** | (2020.01) |
| ***H01R 12/72*** | (2011.01) |
| ***H01R 13/40*** | (2006.01) |

(52) U.S. Cl.

CPC ....... *G01R 27/205* (2013.01); *G01R 31/1272* (2013.01); *H01R 12/721* (2013.01); *H01R 13/40* (2013.01)

(58) Field of Classification Search

CPC .. G01R 31/1272; G01R 27/205; H01R 13/40; H01R 12/721

See application file for complete search history.

(56) References Cited

U.S. PATENT DOCUMENTS

| | | | |
|---|---|---|---|
| 5,241,277 A | 8/1993 | Kefalas et al. | |
| 7,397,251 B2 | 7/2008 | King et al. | |
| 8,223,181 B2 * | 7/2012 | Crockett | B41J 2/3353 347/206 |
| 8,629,688 B2 * | 1/2014 | Chu | G01N 17/002 324/699 |
| 10,082,447 B2 | 9/2018 | Estevo et al. | |
| 10,333,260 B2 | 6/2019 | Card et al. | |
| 10,379,149 B2 | 8/2019 | Davies et al. | |
| 10,408,869 B1 | 9/2019 | Patwardhan et al. | |
| 10,921,358 B2 | 2/2021 | Lai et al. | |
| 11,088,404 B2 | 8/2021 | Koujiya et al. | |

(Continued)

OTHER PUBLICATIONS

"Changing the Interposer Plug Count", https://www.ibm.com/docs/en/power5?topic=configuration-changing-interposer-plug-count, Mar. 4, 2021, pp. 1.

(Continued)

*Primary Examiner* — Thang X Le

(74) *Attorney, Agent, or Firm* — CHIP LAW GROUP

(57) ABSTRACT

A testing device that includes a resistance measuring device electrically communicating across connection points which electrically includes an electrical connector. The testing device also includes a threshold monitor analyzing the resistance being measurable using the resistance meter to determine when the resistance exceeds a threshold for contact resistance. Finally, the testing device also includes a warning indicator. The warning indicator triggered in response to the resistance exceeding the threshold indicates to replace the connector.

18 Claims, 11 Drawing Sheets

(56) References Cited

U.S. PATENT DOCUMENTS

| | | | | |
|---|---|---|---|---|
| 11,152,729 | B2 | 10/2021 | Martens et al. | |
| 11,378,611 | B1 | 7/2022 | Lin et al. | |
| 2011/0254563 | A1* | 10/2011 | Liu | A61B 6/4208 324/705 |
| 2014/0039693 | A1 | 2/2014 | Havens et al. | |
| 2016/0334325 | A1* | 11/2016 | Jaworowski | G01N 27/041 |
| 2020/0264093 | A1* | 8/2020 | Campbell | G01N 17/04 |
| 2021/0042395 | A1 | 2/2021 | Canfield et al. | |
| 2021/0066838 | A1* | 3/2021 | Myers | C23C 28/30 |
| 2024/0402219 | A1* | 12/2024 | Smith | B08B 1/14 |

OTHER PUBLICATIONS

Jiang et al., "Prediction of electrical contact endurance subject to micro-slip wear using friction energy dissipation approach" Friction, 7, Jul. 6, 2018, pp. 537-550.

Kadechkar et al., "Low-cost online contact resistance measurement of power connectors to ease predictive maintenance", IEEE Transactions on Instrumentation and Measurement, 68(12), Mar. 12, 2019, pp. 4825-4833.

Ni et al., "Evolution of contact performance of industry electrical connector based on reliability accelerated testing", Advances in Mechanical Engineering, 13(2), Feb. 1, 2021, pp. 1-12.

Pompanon et al., "Normal force and displacement amplitude influences on silver-plated electrical contacts subjected to fretting wear: a basic friction energy-contact compliance formulation", Wear, 426, Apr. 2019, pp. 652-661.

Yuan et al., "An Improved Calculation Model for the Prediction of the Wear of Coated Electrical Contacts". Technologies, 7(4), Oct. 31, 2019, pp. 1-13.

* cited by examiner

AUTOMATED ELECTRICAL CONNECTOR WEAR MONITORING

BACKGROUND

The present invention generally relates to electrical components including connectors, and more particularly to the wear of electrical connectors.

As electrical connectors mate over time during plugging/unplugging cycles, or even transportation vibration, the surfaces can degrade by wearing. For example, when the connector is a coated structure of multiple compositions, the wear may go through an outer metallic coating, e.g., such as gold, then the wear can extend through an underlying coating, such as nickel, and into the copper. Over time the copper can corrode thereby causing a risk of the electrical connection degrading therefore creating latent failures. Another disadvantage is that when one of the connector halves is damaged (as in a test card, module, etc.) then it risks damaging fresh connectors which are plugged to it. This may be referred to as a mechanical virus.

SUMMARY

In accordance with some embodiments of the present disclosure, the methods, structures and computer products of the present disclosure, have been provided for automated electrical connector wear indication.

In one aspect, a device is provided for automated electrical connector wear indication during a hardware test. In one embodiment, the testing device includes a resistance measuring device electrically communicating across connection points which electrically includes an electrical connector. The testing device also includes a threshold monitor analyzing the resistance being measurable using the resistance meter to determine when the resistance exceeds a threshold for contact resistance. Finally, the testing device also includes a warning indicator. The warning indicator triggered in response to the resistance exceeding the threshold indicates to replace the connector.

In another aspect, a method is provided for automated electrical connector wear indication during a hardware test. In one embodiment, the method includes measuring a resistance across connection points which electrically includes an electrical connector, and determining when a change in the resistance exceeds a threshold for contact resistance. The method can also include triggering a warning indicator, in response to the resistance exceeding the threshold, to replace the connector.

In some aspects, the aforementioned method may be computer implemented. In one embodiment, a computer program product is provided for automated electrical connector wear indication during a hardware test. The computer program product can include a computer readable storage medium having computer readable program code embodied therewith. The program instructions executable by a processor to cause the processor to measure a resistance across connection points that electrically includes an electrical connector, and determine when a change in the resistance exceeds a threshold for contact resistance. The method implemented by the program instruction can also include trigger, using the hardware processor, a warning indicator to replace the connector in response to the resistance exceeding the threshold.

BRIEF DESCRIPTION OF THE DRAWINGS

The following description will provide details of preferred embodiments with reference to the following figures wherein.

DETAILED DESCRIPTION

The methods, systems, and computer program products described herein can provide for automated connection wear monitoring. As electrical connectors are mated together, e.g., plugged into one another, over time during plugging/unplugging cycles or even transportation vibration, the surfaces can degrade by wearing. The wearing of the surfaces can degrade both metallic coatings and base substrates. For example, a multilayered contact may include a contact surface of a connector can have a gold coating, under which is a nickel coating and a copper substrate. In this example, as the electrical connector experiences cycles of connecting and disconnecting, i.e., plugging and unplugging, as well as vibration, the mechanical friction of engaging the contact surfaces can cause the contacts to wear through the gold layer, then through the nickel layer, and into the copper base structure. Over time the copper can corrode thereby causing a risk of the electrical connection degrading therefore creating latent failures. Further, when one of the connector halves is damaged (as in a test card, module, etc) then it risks damaging fresh connectors which are plugged into it.

Performing connector studies to identify the max plug count is the only known solution in the industry. However, many drawbacks have been observed. First, if the results of connector studies are too conservative, discarding good test cards can be costly. Further, if actions based on the connector studies are too aggressive, there is a risk that defective parts can be passed off to the customer. It has been determined that there is a wide variation in how connectors wear due to contact shape, materials, manufacturing tolerances, etc. The structures, methods and computer program products described here detect the degradation of the contact via an electrical conductivity test performed during the hardware test. Electrical conductivity tests can determine wear without being subject to variations in contacts due to contact shape, materials, manufacturing tolerances, etc. Additionally, the electrical conductivity tests may be low level contact resistance (LLCR) tests that can be performed with existing hardware testing, providing for an automated connection wear monitoring without requiring additional testing, e.g., additional test hardware. The methods, systems and computer program products of the present disclosure are now described in greater detail with reference to FIGS. 1-11.

Figure 1:
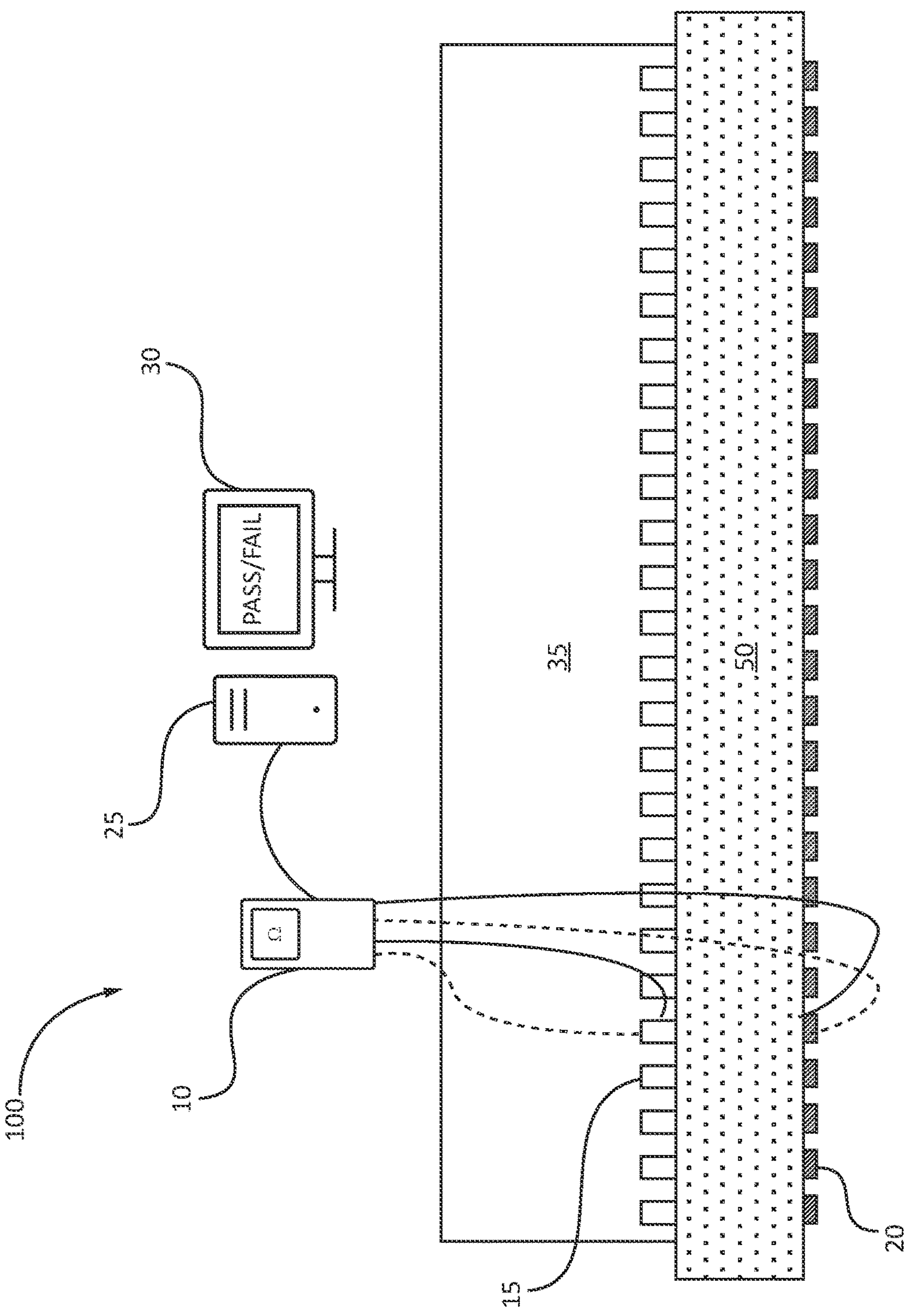
FIG. 1 is a diagram illustrating a device for automated electrical connector wear indication during a hardware test using a four point resistance test, in which the connector contact are electrically conductive features of a printed circuit board, in accordance with one embodiment of the present disclosure.
Figure 2:
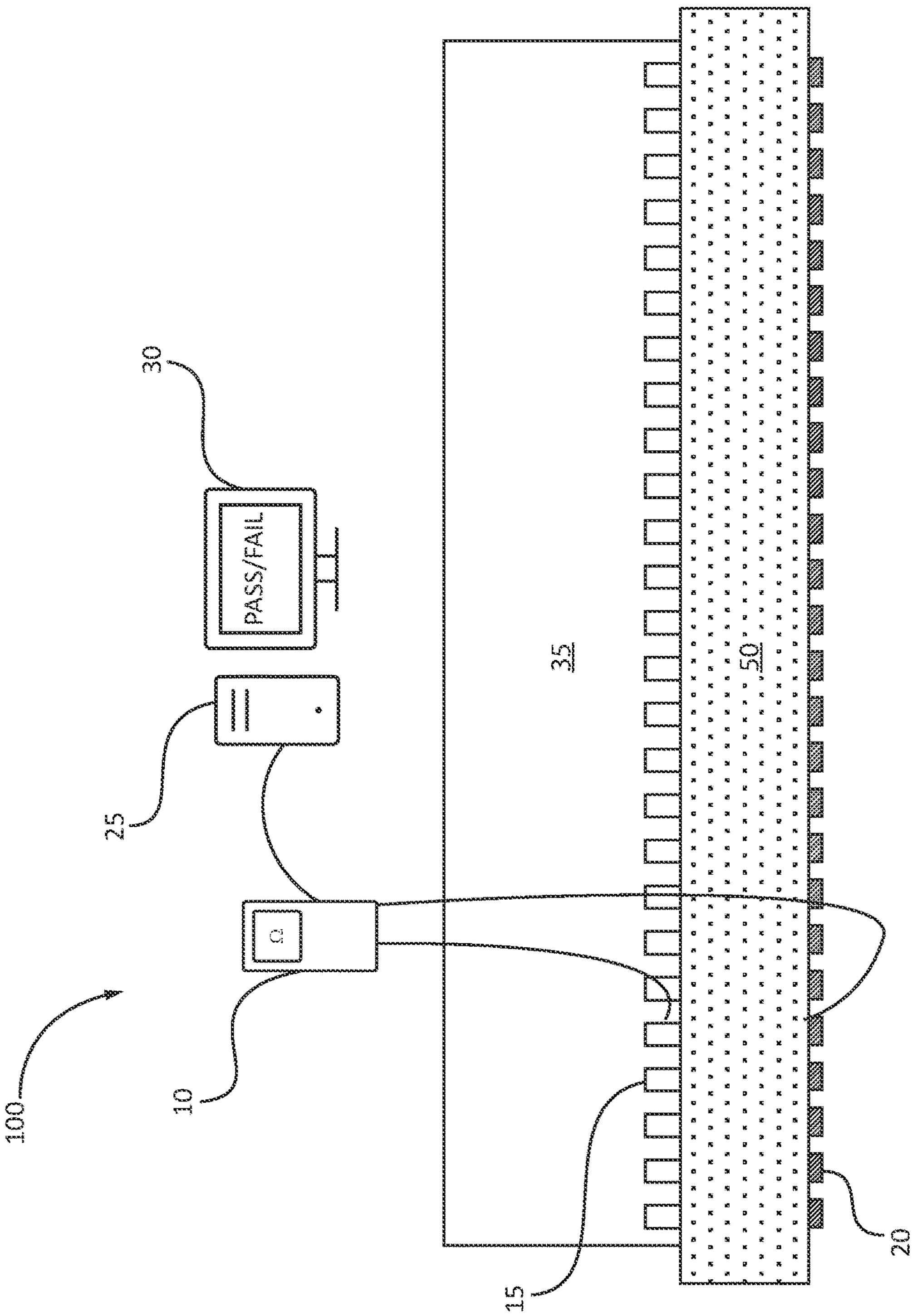
FIG. 2 is a diagram illustrating a device for automated electrical connector wear indication during a hardware test using a two point resistance test, in which the connector contact are electrically conductive features of a printed circuit board, in accordance with one embodiment of the present disclosure.

FIGS. 1 and 2 are diagrams illustrating one embodiment of a device for automated electrical connector wear indication during a hardware test, in which the connector contact are to electrically conductive features of a printed circuit board (PCB). The apparatus depicted in FIG. 1 is one example of a device that can be used in a method to monitor the plug life of test cards and connectors utilizing real-time low level contact resistance (LLCR) measurements with a four point resistance test. The apparatus depicted in FIG. 2 is one example of a device that can be used in a method to monitor the plug life of test cards and connectors utilizing real-time low level contact resistance (LLCR) measurements with a two point resistance test.

In one aspect, a device is provided for automated electrical connector wear indication during a hardware test. In one embodiment, the testing device 100 includes a resistance measuring device 10 electrically communicating across connection points which electrically includes an electrical connector. The testing device also includes a threshold monitor 25 analyzing the resistance being measurable using the resistance measuring device 10 to determine when the resistance exceeds a threshold for contact resistance. Finally, the testing device 100 also includes a warning indicator 30. The warning indicator 30 triggered in response to the resistance exceeding the threshold indicates to replace the connector.

Figure 3:
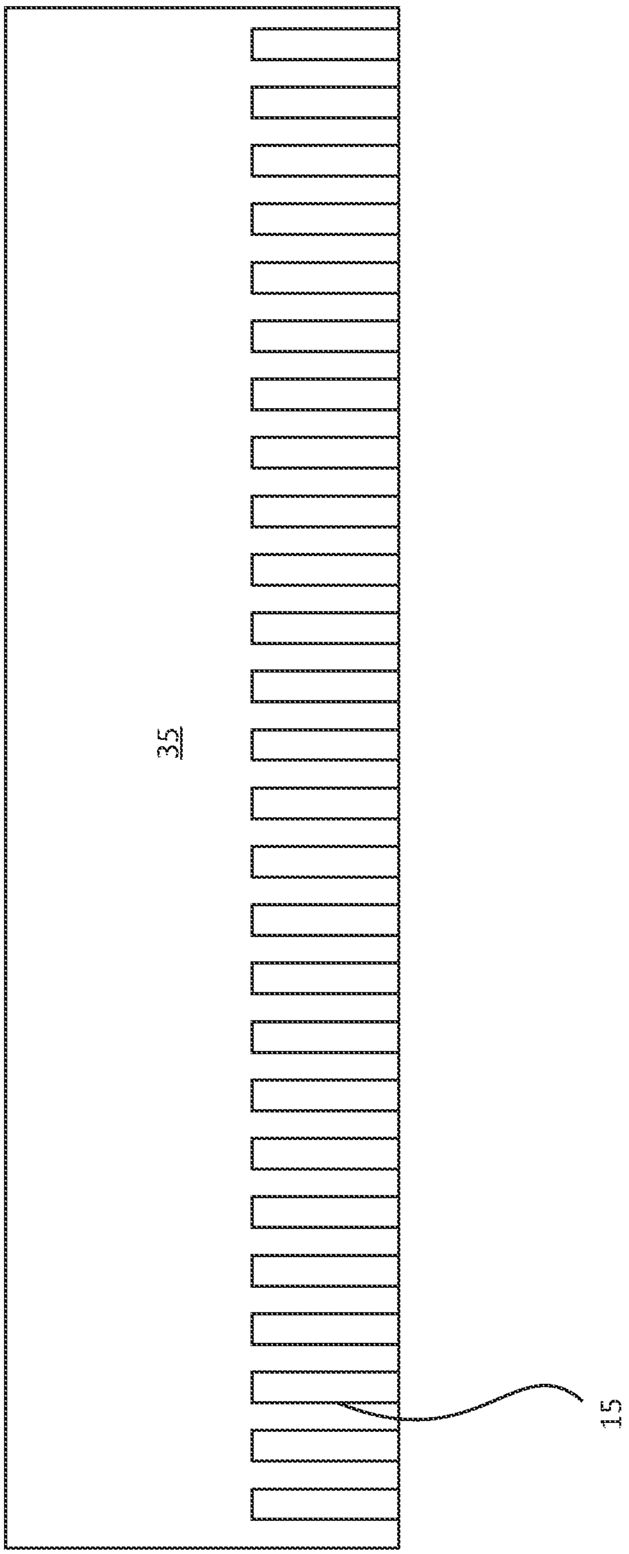
FIG. 3 is a top down view of a card edge of a printed circuit board (PCB), in accordance with one embodiment of the present disclosure.
Figure 4:
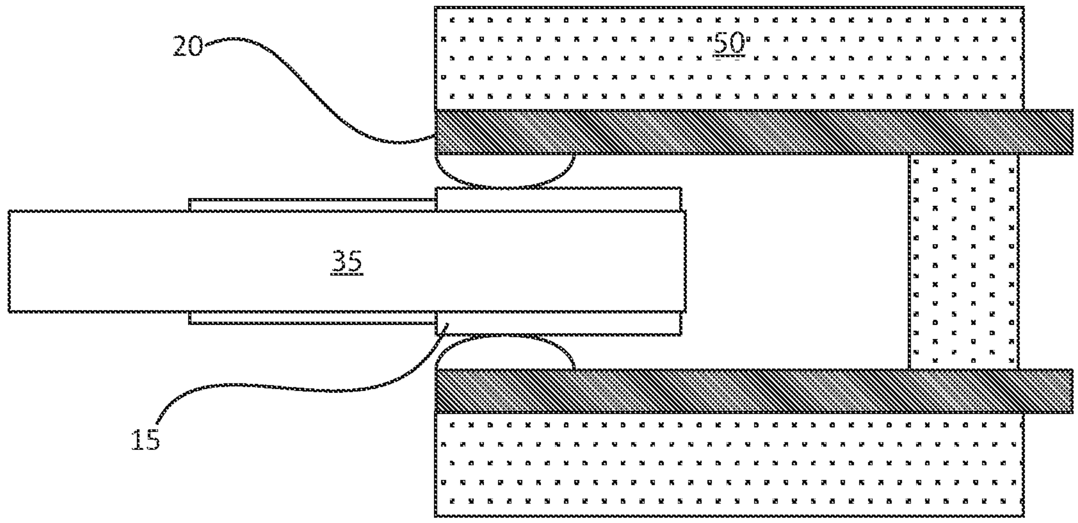
FIG. 4 is a side cross-sectional view of a card edge connector, in accordance with one embodiment of the present disclosure.

The embodiments depicted in FIGS. 1 and 2 may include a spare or an additional connector contact 50 (each individual contact pair includes a pair of connector contact 20) that is wired such that low level contact resistance (LLCR) measurements can be performed after the connector contact is plugged. The connector 50 including the pair of connector contacts 20 is plugged into the printed circuit board (PCB) card edge contact 15 of a printed circuit board 35. One embodiment of a PCB card edge contact 15 of a printed circuit board 35 is depicted in FIG. 3. In some embodiments a copper lead 9 is in electrical communication between the PCB 35 and the PCT edge card contact 15. There is a PCB edge card contact 15 on each side of the printed circuit board 15 for engagement to the pair of connector contacts 20. LLCR is measured for each plugged connector contact 15. If the measured contact resistance exceeds a threshold and/or the standard deviation in contact resistance exceeds a threshold, the system monitoring the LLCR would trigger a warning indicating the user should replace the test card or test connector including the connector contact 15.

Figure 5:
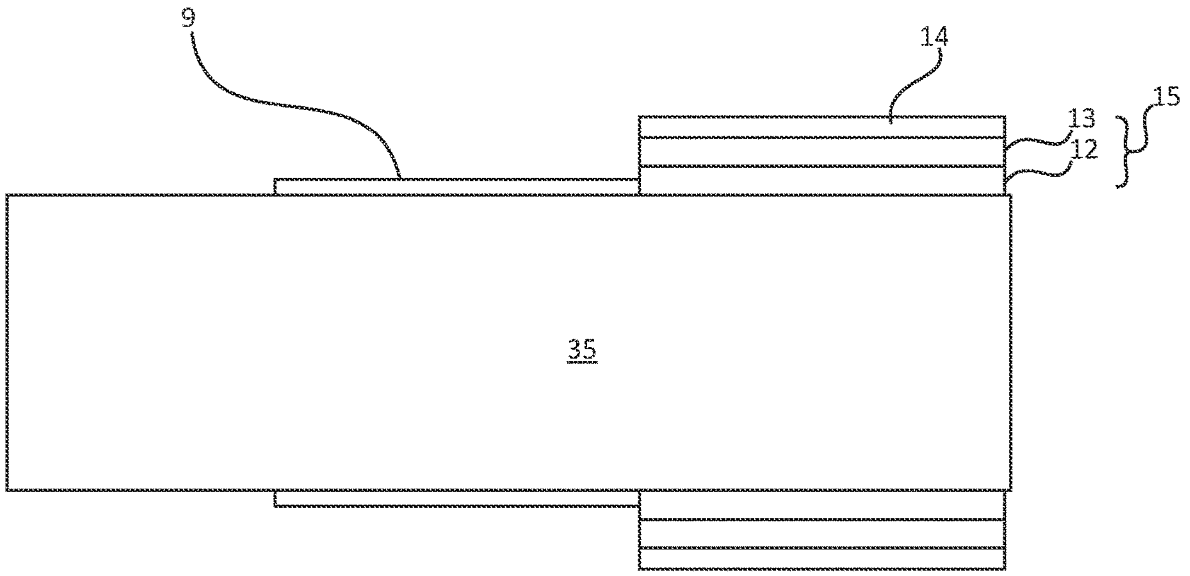
FIG. 5 is a side cross-sectional view of PCB card edge contact including three metal composition layers, in accordance with one embodiment of the present disclosure.

FIG. 5 depicts one embodiment of a PCB card 35 including PCB edge card contacts 15 including three metal composition layers. For example, the first layer of the PCB edge card contacts 15 for the test card/test connector may be composed of copper (Cu) (copper layer 12), and the copper (Cu) may have a resistivity of $1.7\times10^{-8}$ Ohm. The second layer of the test card/test connector 15 may be composed of nickel (Ni) (nickel layer 13), and the nickel (Ni) may have a resistivity of $7\times10^{-8}$ Ohm. The third layer of the PCB edge card contacts 15 for the test card/test connector may be composed of gold (Au) (gold layer 14), and the gold (Au) may have a resistivity of $2.4\times10^{-8}$ Ohm.

The testing device 100 includes a pair connector contacts 20 of a connector 50 that are placed in electrical communication with the PCB edge card contacts 15 of the test card/test connector. The pair connector contacts 20 may be composed of a metal, such as copper, and are electrically conductive to take contact resistance measurements from the PCB edge card contacts 15 of the test card/test connector.

The testing device 100 further includes a resistance measuring device 10. The resistance measuring device 10 may be an analog ohmmeter. However, the resistance measuring device 10 may be built into a hardware tester. An ohmmeter is an electrical instrument used to measure the resistance in a circuit or a component. The opposition to the flow of electric current is a measure of resistance in the electrical circuit. The unit of electrical resistance is ohms (Q). The units of contact resistance are in Q. In some examples, the resistance measuring device may work based on when a measuring device 10 applies current to the circuit or component, it measures the resulting voltage and calculates the resistance value using ohms law formula V=IR.

Referring to FIGS. 1 and 2, the resistance measuring device 10 may be in communication with a threshold monitor 25 analyzing the resistance being measurable using the resistance measuring device 10 to determine when the resistance exceeds a threshold for resistance, e.g., contact resistance.

Figure 7:
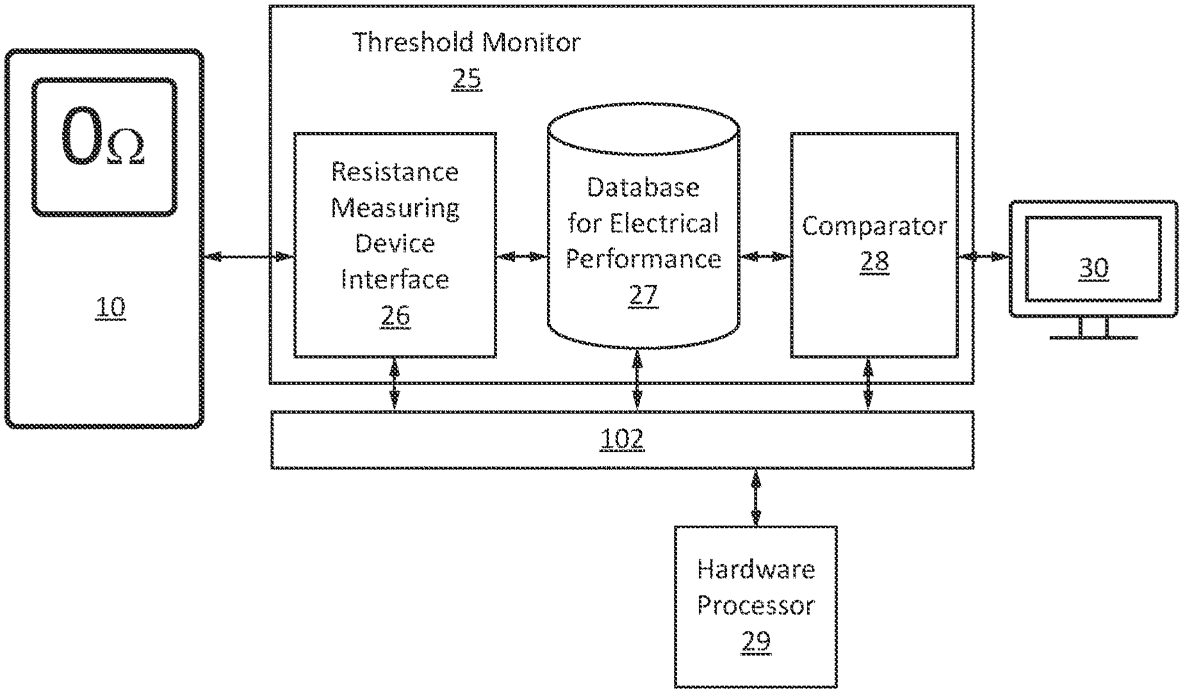
FIG. 7 is a flow/block diagram depicting a system for automated electrical connector wear indication during a hardware test, in accordance with one embodiment of the present disclosure.
Figure 8:
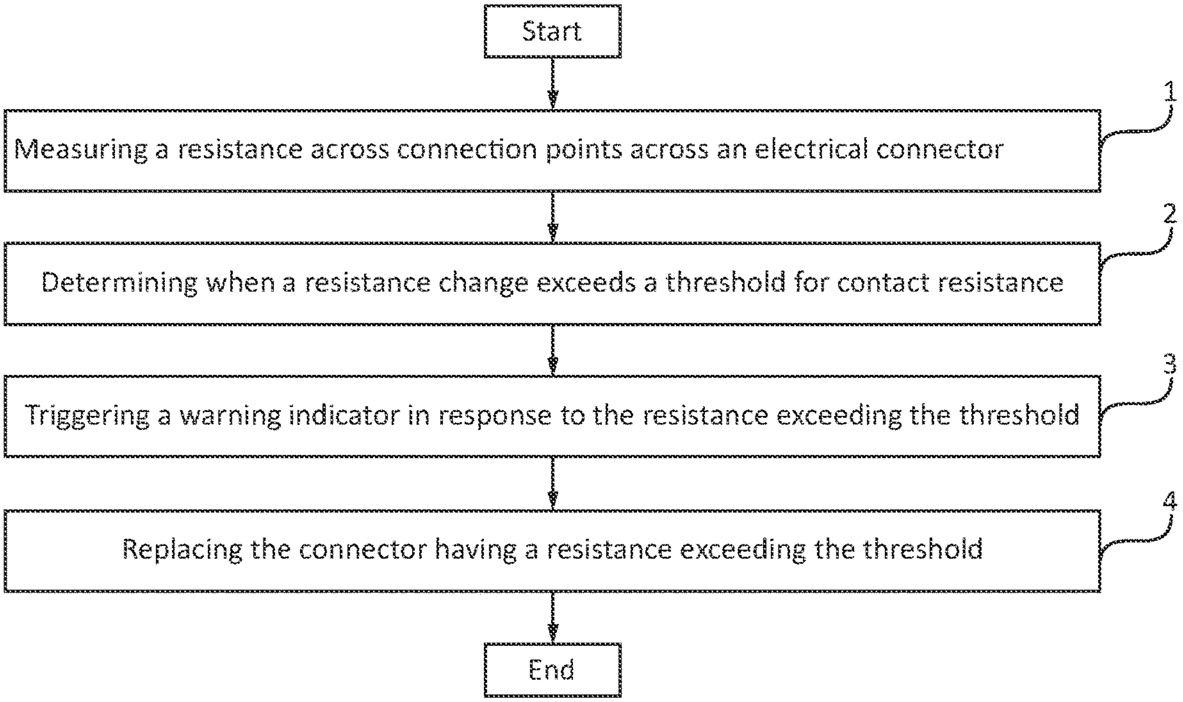
FIG. 8 is a flow/block diagram showing a computer implemented method for automated electrical connector wear indication during a hardware test, in accordance with one embodiment of the present disclosure.

FIG. 7 is a flow/block diagram depicting a system for automated electrical connector wear indication during a hardware test. More particularly, the system includes the threshold monitor 25. The threshold monitor 25 includes an input, i.e., resistance measuring device interface 26, that is in electrical communication with the resistance measuring device 10. The threshold monitor 25 may be a computing device including at least one hardware processor 29, and memory. The memory may include a database of electrical characteristics 27 for the PCB edge card contacts 15 of the test card/test connector. For example, the database 27 may include electrical characteristics for the PCB edge card contacts 15 of the test card/test connector including the layered stack of the copper layer 12/nickel layer 13/gold layer 14. For example, the stored data in the threshold monitor 25 may indicate that wear through the gold layer 14 will indicate an increase in resistance of approximately 3×. The data may further indicate that as the wear continues to the copper layer 12, the resistance will decrease (unless there is an oxidation layer).

Still referring to FIG. 7, using the input data, e.g., contact resistance measurements, from the resistance measuring device 10, and the stored electrical characteristics for the PCB edge card contacts 15 of the test card/test connector from the database of electrical characteristics 27, the comparator 28 can determine if the measured resistance, e.g., contact resistance, from the PCB edge card contacts 15 of the test card/test connector exceeds a threshold value and/or the standard deviation in contact resistance exceeds a threshold, based on the electrical characteristics in the database 27. To compare and calculate deviations from a threshold value, the threshold monitor 25 may employ at least one hardware processor. As employed herein, the term "hardware processor subsystem" or "hardware processor" can refer to a processor, memory, software or combinations thereof that cooperate to perform one or more specific tasks. In useful embodiments, the hardware processor subsystem can include one or more data processing elements (e.g., logic circuits, processing circuits, instruction execution devices, etc.). The one or more data processing elements can be included in a central processing unit, a graphics processing unit, and/or a separate processor- or computing element-based controller (e.g., logic gates, etc.). The hardware processor subsystem can include one or more on-board memories (e.g., caches, dedicated memory arrays, read only memory, etc.). In some embodiments, the hardware processor subsystem can include one or more memories that can be on or off board or that can be dedicated for use by the hardware processor subsystem (e.g., ROM, RAM, basic input/output system (BIOS), etc.).

In some embodiments, the hardware processor subsystem can include and execute one or more software elements. The one or more software elements can include an operating system and/or one or more applications and/or specific code to achieve a specified result.

In other embodiments, the hardware processor subsystem can include dedicated, specialized circuitry that performs one or more electronic processing functions to achieve a specified result.

Such circuitry can include one or more application-specific integrated circuits (ASICs), FPGAs, and/or PLAs.

Referring to FIGS. 1, 2 and 3, in some embodiments, when the threshold monitor 25 determines that the measured resistance from the resistance measuring device 10 exceeds the threshold value, the threshold monitor 25 triggers a warning indicating that the user should replace the test card and/or test connector. More specifically, the comparator 28 triggers a warning as an output from the threshold monitor 25. In the embodiment depicted in FIGS. 1, 2 and 3, the warning may be triggered using a visual message, such as a message displayed on a monitor 30. It is noted that this is only one example of the present disclosure, and that other embodiments have also been contemplated. For example, the warning may be triggered using an auditory alarm. The warning indicator 30 triggered in response to the resistance exceeding the threshold indicates to replace the connector.

Figure 6:
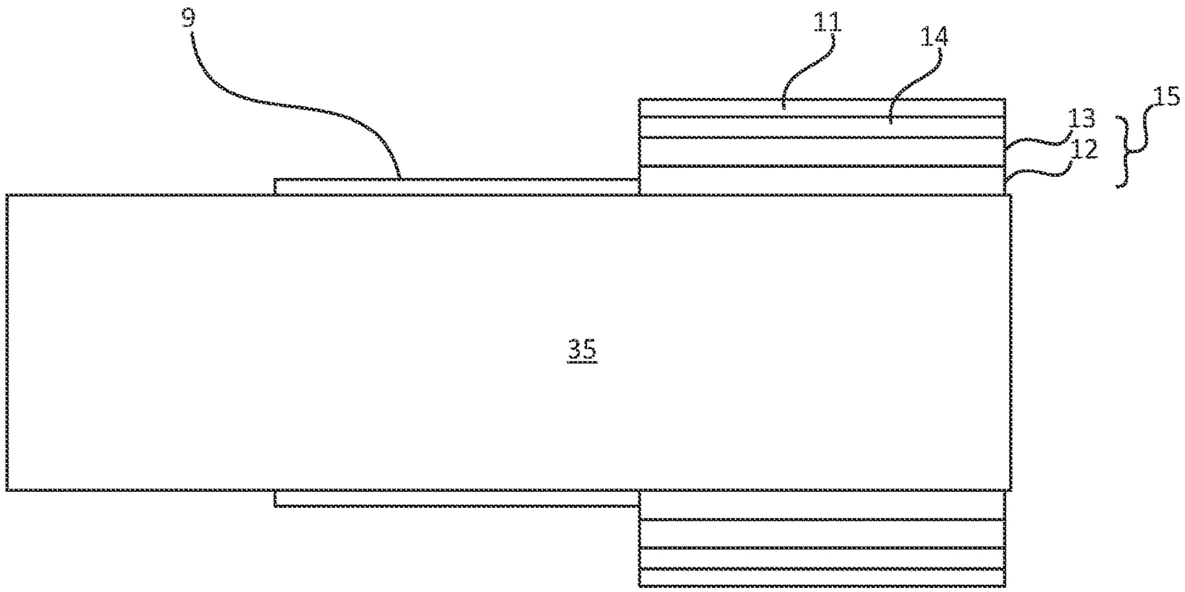
FIG. 6 is a side cross-sectional view of PCB card edge contact including an insulating coating atop three metal composition layers, in accordance with one embodiment of the present disclosure.

FIG. 6 illustrates another embodiment of a device for automated electrical connector wear indication during a hardware test, in which the PCB edge card contacts 15 of the test card/test connector further include an insulating coating 11. Similar to the embodiments described with reference to FIGS. 1, 2 and 5, for testing the PCB edge card contacts 15 of the test card/test connector depicted in FIG. 6, a spare or an additional connector 50 including a contact pair 20 is wired such that resistance can be measured across the mating contacts 20 through the PCB edge card contacts 15, in which the contacts 20 are in direct electrical contact with the insulating layer 11 (also referred to as insulating coating 11). It is noted that the embodiment depicted in FIG. 6 includes a number of elements identical to the embodiment depicted in FIG. 5. In some embodiments, the elements depicted in FIG. 6 having the same reference numbers that are depicted in FIG. 5 may be described using the description of these reference number labeled elements from the above description of FIG. 5.

Referring to FIG. 6, in some embodiments, an insulative coating 11 may be applied to the spare contact/pad in the PCB edge card contacts 15 for the test connector and/or test card. After a specified (X) number of connector mating steps, e.g., plugging/unplugging cycles, the insulative coating 11 wears away, exposing the underlying contact metallurgy, e.g., the gold layer 14. During this plug cycle, the resistance across the contact pair 20 will go from electrically open (or a high resistance value) to electrically connected (or a lower resistance value). The wear rate of the insulative coating 11 is correlated to the wear rate of the gold 14. The thickness of the insulative coating 11 can be determined such that the insulative coating 11 wears off at a plug cycle count lower than what would be needed to cause damage to the neighboring gold contacts. The thickness and type of insulative coating can be correlated to be consistent with the wear of the gold layer 14. Once the wear breaks through the insulating coating 11, the detection method can provide an understanding of where the contact metallurgy, e.g., gold layer 14, is wearing also.

In some embodiments, the insulative coating 11 may be any insulative material that can be deposited onto a Au, Ni, or Cu surface, such as solder mask, and more generally any polymer or ceramic material.

In some embodiments, the insulative coating 11 can also be oxide that results from an oxide treatment of the underlying metallurgy. For example, if the underlying metal is copper, a copper oxide treatment could be performed to render the exposed surface CuO or $CuO_2$.

The embodiments depicted in FIGS. 1-6 are for test cards used to test connectors. The Embodiments could be reversed and applied to test connectors used to test cards.

FIG. 7 illustrates one embodiment of a method for automated connector wear monitoring. Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

In some embodiments, the method may include measuring a resistance across connection points which electrically includes an electrical connector at block 1. Block 2 includes determining when a change in the resistance being measured exceeds a threshold for contact resistance. Block 3 may include triggering a warning indicator in response to the resistance exceeding the threshold. In a following process step, the method may include replacing the connector when the resistance of the connector exceeds the threshold at block 4.

Figure 9:
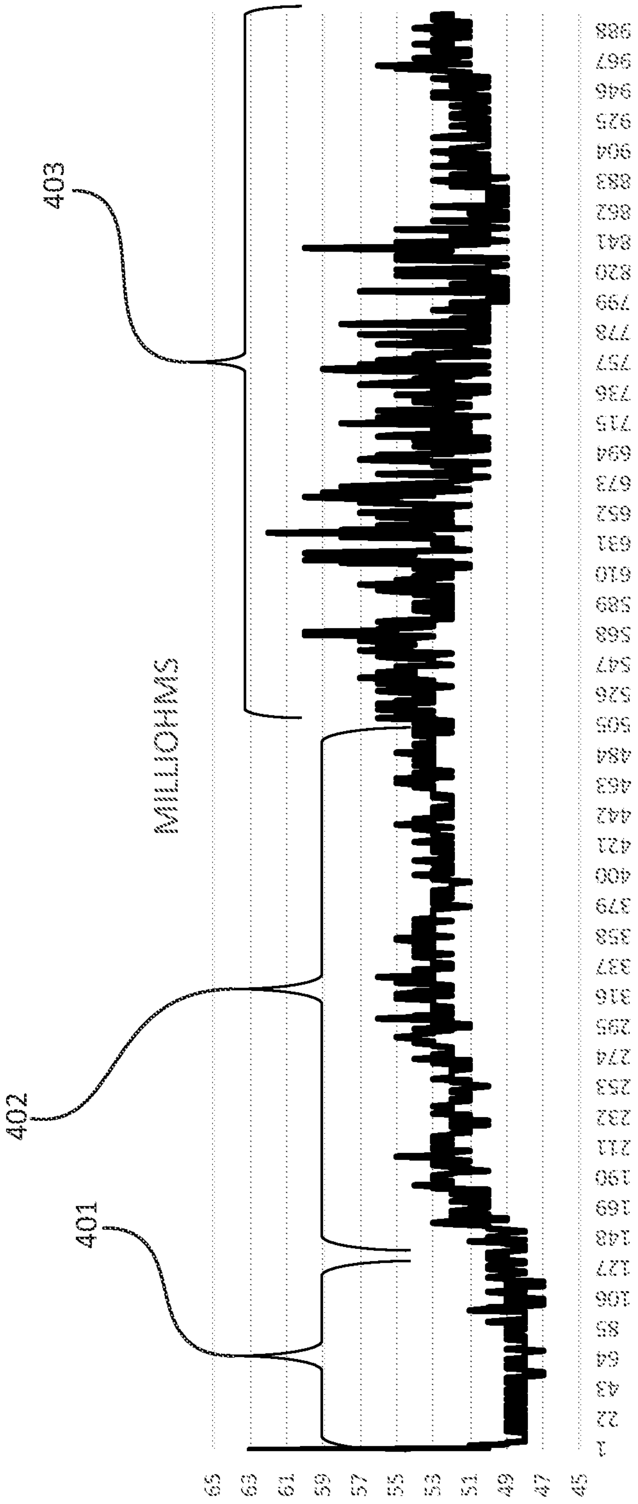
FIG. 9 is a plot illustrating the different phases of connector wear as measured through changes in contact resistance.

FIG. 9 is a plot illustrating the different phases of connector wear as measured through changes in contact resistance. The data plotted in FIG. 9 was produced by the PCB edge card contacts 15 of a test card and connector that was plugged 1000× times and the contact resistance was measured for each plug. The data plotted in FIG. 9 illustrates that the contact resistance appears to go through 3-4 distinct phases. The resistance measurements can begin with an initial breakthrough of corrosion inhibitor. The first phase identified by reference number 401 is a steady-state contact resistance around ~50 micro ohms. The second phase identified by reference number 402 is a steady-state contact resistance with a nominal increase compared to the phase identified by reference number 401. The third phase identified by reference number 403 is variable contact resistance phase. The data illustrated in FIG. 5 illustrates one example of the type of data that can be used to determine a threshold value, or whether the plug cycles have exceeded a threshold voltage, as employed by the threshold monitor 25.

Figure 10:
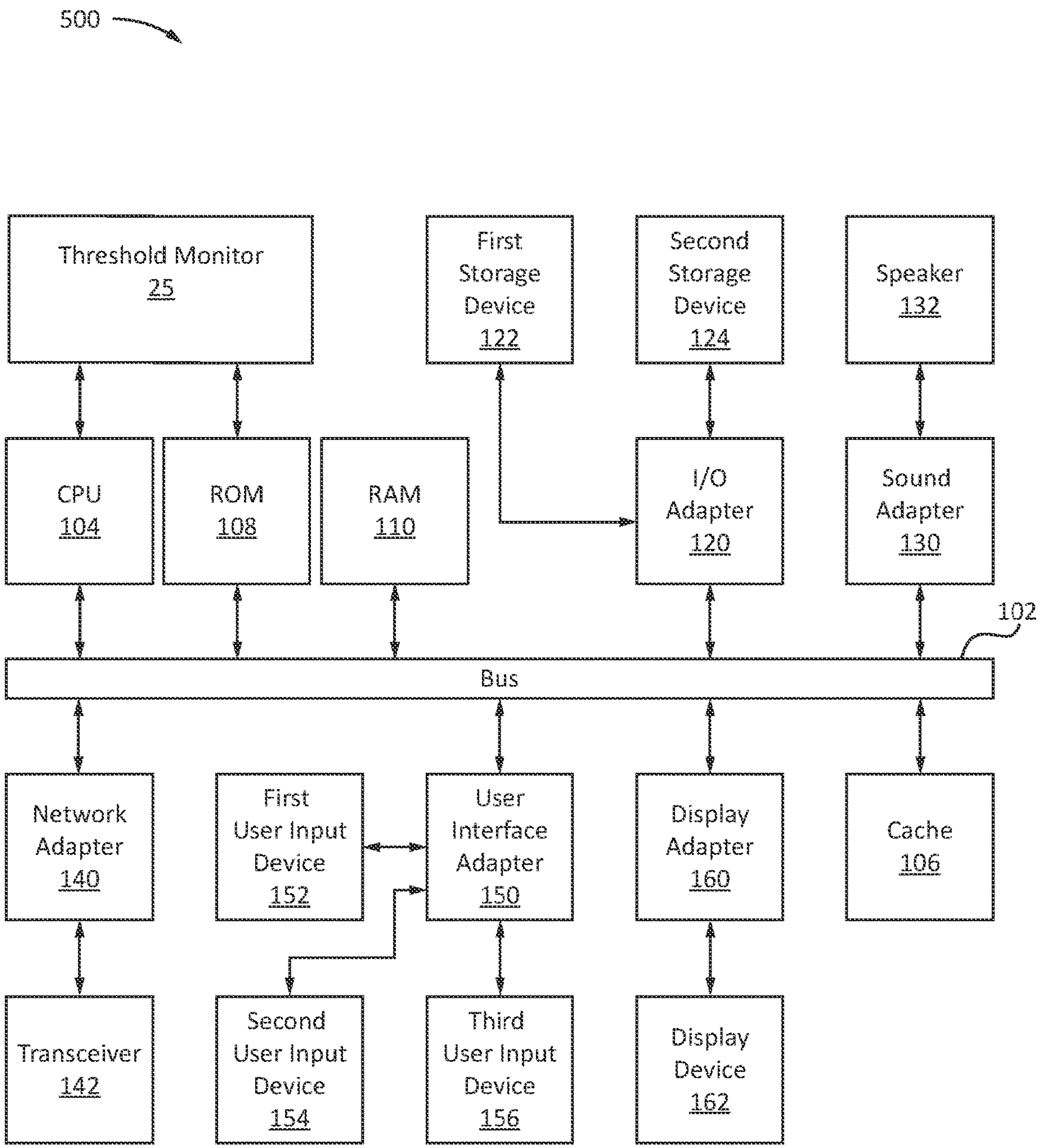
FIG. 10 is a block diagram illustrating a system that can incorporate the system for automated electrical connector wear indication during a hardware test that is depicted in FIG. 7, in accordance with one embodiment of the present disclosure.

Referring to FIGS. 1, 2, 7 and 10, in some embodiments, the components of the automated connector wear monitoring system are interconnected by a bus 102. The bus 102 may also be in communication with at least one hardware processor, in which the hardware processor 29 may function with the other elements depicted in FIG. 7 to provide the functions described above. FIG. 10 further illustrates a processing system 500 that can include the systems for automated electrical connector wear monitoring that is described with reference to FIGS. 1-9. The exemplary processing system 500 to which the present invention may be applied is shown in accordance with one embodiment.

The processing system 500 includes at least one processor (CPU) 104 operatively coupled to other components via a system bus 102. The system bus 102 may be in communication with the system for automated connector wear monitoring. A cache 106, a Read Only Memory (ROM) 108, a Random Access Memory (RAM) 110, an input/output (I/O) adapter 120, a sound adapter 130, a network adapter 140, a user interface adapter 150, and a display adapter 160, are operatively coupled to the system bus 102.

A first storage device 122 and a second storage device 124 are operatively coupled to system bus 102 by the I/O adapter 120. The storage devices 122 and 124 can be any of a disk storage device (e.g., a magnetic or optical disk storage device), a solid state magnetic device, and so forth. The storage devices 122 and 124 can be the same type of storage device or different types of storage devices.

A speaker 132 is operatively coupled to system bus 102 by the sound adapter 130. A transceiver 142 is operatively coupled to system bus 102 by network adapter 140. A display device 162 is operatively coupled to system bus 102 by display adapter 160.

A first user input device 152, a second user input device 154, and a third user input device 156 are operatively coupled to system bus 102 by user interface adapter 150. The user input devices 152, 154, and 156 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 152, 154, and 156 can be the same type of user input device or different types of user input devices. The user input devices 152, 154, and 156 are used to input and output information to and from system 400.

Of course, the processing system 500 may also include other elements (not shown), as readily contemplated by one of skill in the art, as well as omit certain elements. For example, various other input devices and/or output devices can be included in processing system 500, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the processing system 500 are readily contemplated by one of ordinary skill in the art given the teachings of the present invention provided herein.

The present invention may be a system, a method, and/or a computer program product at any possible technical detail level of integration. For example, in some embodiments, a computer program product is provided for automated connector wear monitoring. The computer program product can include a computer readable storage medium having computer readable program code embodied therewith. The program instructions executable by a processor to cause the processor to measure a resistance across connection points that electrically includes an electrical connector, and determine when the resistance exceeds a threshold for contact resistance. The method implemented by the program instruction can also include trigger, using the hardware processor, a warning indicator to replace the connector in response to the resistance exceeding the threshold.

The computer program product may include a computer readable storage medium (or media) having computer readable program instructions thereon for causing a processor to carry out aspects of the present invention. The computer program produce may also be non-transitory.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a wave-guide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

These and other variations of a hardware processor subsystem are also contemplated in accordance with embodiments of the present invention.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing.

A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

Figure 11:
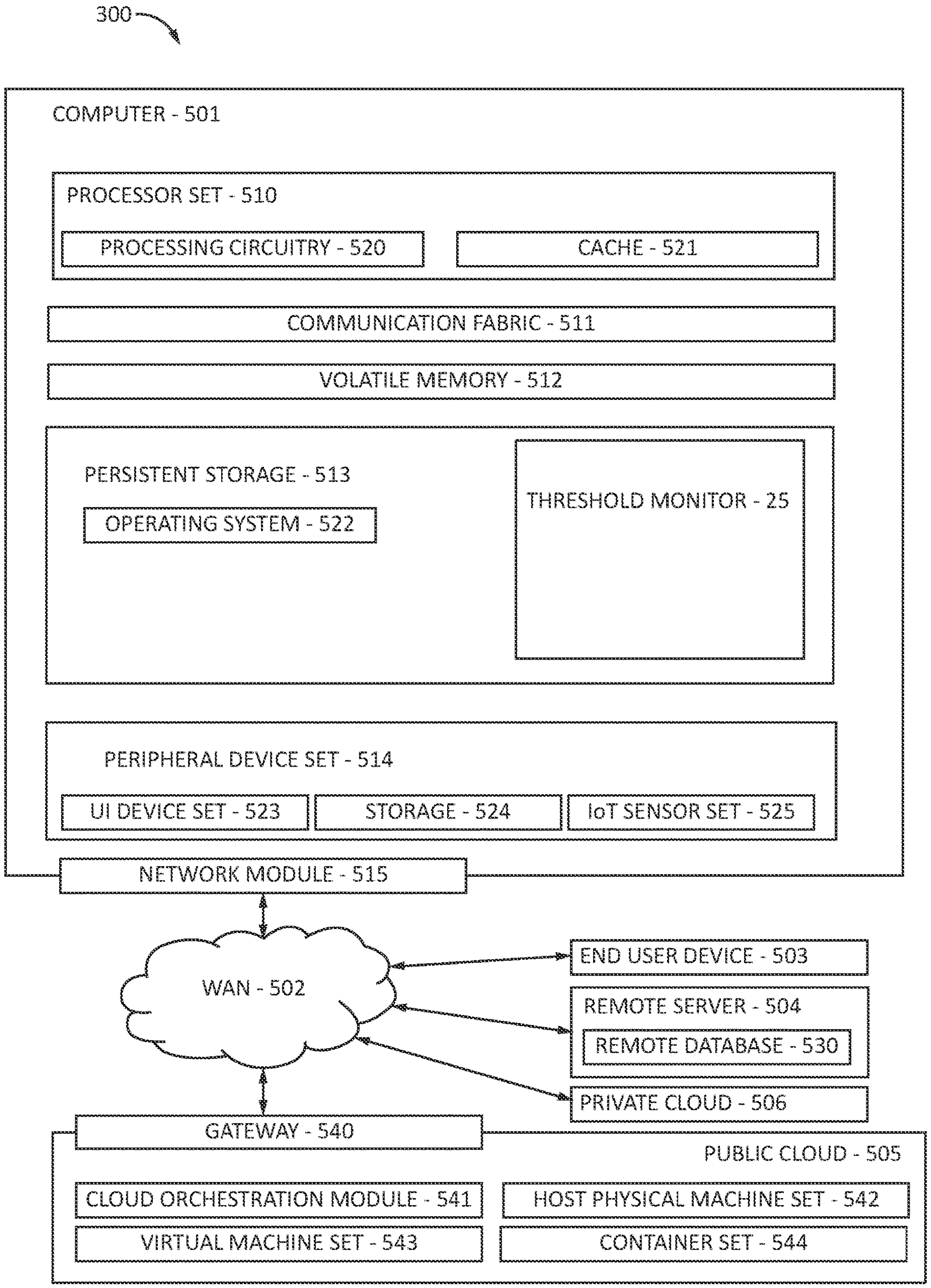
FIG. 11 is a block diagram illustrating a computing environment that contains an example of an environment for the execution of at least some of the computer code involved in performing the inventive methods.

Referring to FIG. 11, the computing environment 300 contains an example of an environment for the execution of at least some of the computer code involved in performing the inventive methods. In addition to block 100, computing environment 300 includes, for example, computer 501, wide area network (WAN) 502, end user device (EUD) 503, remote server 504, public cloud 505, and private cloud 506. In this embodiment, computer 501 includes processor set 510 (including processing circuitry 520 and cache 521), communication fabric 511, volatile memory 512, persistent storage 513 (including operating system 522 and block 100, as identified above), peripheral device set 514 (including user interface (UI), device set 523, storage 524, and Internet of Things (IoT) sensor set 525), and network module 515. Remote server 504 includes remote database 530. Public cloud 505 includes gateway 540, cloud orchestration module 541, host physical machine set 542, virtual machine set 543, and container set 544.

COMPUTER 501 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 530. As is well understood in the art of computer technology, and depending upon the technology, performance of a computer-implemented method may be distributed among multiple computers and/or between multiple locations. On the other hand, in this presentation of computing environment 300, detailed discussion is focused on a single computer, specifically computer 501, to keep the presentation as simple as possible.

Computer 501 may be located in a cloud, even though it is not shown in a cloud in FIG. 11. On the other hand, computer 501 is not required to be in a cloud except to any extent as may be affirmatively indicated.

PROCESSOR SET 510 includes one, or more, computer processors of any type now known or to be developed in the future. Processing circuitry 520 may be distributed over multiple packages, for example, multiple, coordinated integrated circuit chips. Processing circuitry 520 may implement multiple processor threads and/or multiple processor cores. Cache 521 is memory that is located in the processor chip package(s) and is typically used for data or code that should be available for rapid access by the threads or cores running on processor set 510. Cache memories are typically organized into multiple levels depending upon relative proximity to the processing circuitry. Alternatively, some, or all, of the cache for the processor set may be located "off chip." In some computing environments, processor set 510 may be designed for working with qubits and performing quantum computing.

Computer readable program instructions are typically loaded onto computer 501 to cause a series of operational steps to be performed by processor set 510 of computer 501 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 521 and the other storage media discussed below. The program instructions, and associated data, are accessed by processor set 510 to control and direct performance of the inventive methods. In computing environment 300, at least some of the instructions for performing the inventive methods may be stored in block 200 in persistent storage 513.

COMMUNICATION FABRIC 511 is the signal conduction paths that allow the various components of computer 501 to communicate with each other. Typically, this fabric is made of switches and electrically conductive paths, such as the switches and electrically conductive paths that make up busses, bridges, physical input/output ports and the like. Other types of signal communication paths may be used, such as fiber optic communication paths and/or wireless communication paths.

VOLATILE MEMORY 512 is any type of volatile memory now known or to be developed in the future. Examples include dynamic type random access memory (RAM) or static type RAM. Typically, the volatile memory is characterized by random access, but this is not required unless affirmatively indicated. In computer 501, the volatile memory 512 is located in a single package and is internal to computer 501, but, alternatively or additionally, the volatile memory may be distributed over multiple packages and/or located externally with respect to computer 501.

PERSISTENT STORAGE 513 is any form of non-volatile storage for computers that is now known or to be developed in the future. The non-volatility of this storage means that the stored data is maintained regardless of whether power is being supplied to computer 501 and/or directly to persistent storage 513. Persistent storage 513 may be a read only memory (ROM), but typically at least a portion of the persistent storage allows writing of data, deletion of data and re-writing of data. Some familiar forms of persistent storage include magnetic disks and solid state storage devices.

Operating system 522 may take several forms, such as various known proprietary operating systems or open source Portable Operating System Interface type operating systems that employ a kernel.

The code included in block 200 typically includes at least some of the computer code involved in performing the inventive methods.

PERIPHERAL DEVICE SET 514 includes the set of peripheral devices of computer 501. Data communication connections between the peripheral devices and the other components of computer 501 may be implemented in various ways, such as Bluetooth connections, Near-Field Communication (NFC) connections, connections made by cables (such as universal serial bus (USB) type cables), insertion type connections (for example, secure digital (SD) card), connections made though local area communication networks and even connections made through wide area networks such as the internet. In various embodiments, UI device set 523 may include components such as a display screen, speaker, microphone, wearable devices (such as goggles and smart watches), keyboard, mouse, printer, touchpad, game controllers, and haptic devices. Storage 524 is external storage, such as an external hard drive, or insertable storage, such as an SD card. Storage 524 may be persistent and/or volatile. In some embodiments, storage 524 may take the form of a quantum computing storage device for storing data in the form of qubits. In embodiments where computer 101 is required to have a large amount of storage (for example, where computer 501 locally stores and manages a large database) then this storage may be provided by peripheral storage devices designed for storing very large amounts of data, such as a storage area network (SAN) that is shared by multiple, geographically distributed computers. IoT sensor set 525 is made up of sensors that can be used in Internet of Things applications. For example, one sensor may be a thermometer and another sensor may be a motion detector.

NETWORK MODULE 515 is the collection of computer software, hardware, and firmware that allows computer 101 to communicate with other computers through WAN 102. Network module 515 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 515 are performed on the same physical hardware device. In other embodiments (for example, embodiments that utilize software-defined networking (SDN)), the control functions and the forwarding functions of network module 515 are performed on physically separate devices, such that the control functions manage several different network hardware devices. Computer readable program instructions for performing the inventive methods can typically be downloaded to computer 501 from an external computer or external storage device through a network adapter card or network interface included in network module 515. WAN 502 is any wide area network (for example, the internet) capable of communicating computer data over non-local distances by any technology for communicating computer data, now known or to be developed in the future. In some embodiments, the WAN may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

END USER DEVICE (EUD) 503 is any computer system that is used and controlled by an end user (for example, a customer of an enterprise that operates computer 501), and may take any of the forms discussed above in connection with computer 501. EUD 503 typically receives helpful and useful data from the operations of computer 501. For example, in a hypothetical case where computer 501 is designed to provide a recommendation to an end user, this recommendation would typically be communicated from network module 515 of computer 501 through WAN 502 to EUD In this way, EUD 503 can display, or otherwise present, the recommendation to an end user. In some embodiments, EUD 503 may be a client device, such as thin client, heavy client, mainframe computer, desktop computer and so on.

REMOTE SERVER 504 is any computer system that serves at least some data and/or functionality to computer 501. Remote server 504 may be controlled and used by the same entity that operates computer 501. Remote server 504 represents the machine(s) that collect and store helpful and useful data for use by other computers, such as computer 501. For example, in a hypothetical case where computer 501 is designed and programmed to provide a recommendation based on historical data, then this historical data may be provided to computer 501 from remote database 530 of remote server 504.

PUBLIC CLOUD 505 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 505 is performed by the computer hardware and/or software of cloud orchestration module 541. The computing resources provided by public cloud 505 are typically implemented by virtual computing environments that run on various computers making up the computers of host physical machine set 542, which is the universe of physical computers in and/or available to public cloud 505. The virtual computing environments (VCEs) typically take the form of virtual machines from virtual machine set 543 and/or containers from container set 544. It is understood that these VCEs may be stored as images and may be transferred among and between the various physical machine hosts, either as images or after instantiation of the VCE. Cloud orchestration module 541 manages the transfer and storage of images, deploys new instantiations of VCEs and manages active instantiations of VCE deployments. Gateway 540 is the collection of computer software, hardware, and firmware that allows public cloud 505 to communicate through WAN 502.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers.

These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

PRIVATE CLOUD 506 is similar to public cloud 505, except that the computing resources are only available for use by a single enterprise. While private cloud 506 is depicted as being in communication with WAN 502, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 505 and private cloud 506 are both part of a larger hybrid cloud.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of systems and methods for automated connector wear monitoring (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A testing device for electrical connector wear indication during a hardware test comprising:

a resistance measuring device electrically communicating across connection points, the connection points measuring resistance of an electrical connector, wherein the electrical connector includes an insulating coating along a contact area mating with the electrical connector and a multilayered structure of at least two layers of metallic materials with different resistances, wherein one of the layers of metallic materials is immediately below the insulating coating and the thickness and type of insulating coating is correlated to be consistent with wear rate of the layer of metallic material immediately below the insulating coating;

a threshold monitor analyzing a resistance being measured using the resistance measuring device to determine when the resistance exceeds a threshold for contact resistance; and a warning indicator that is triggered in response to the resistance exceeding the threshold indicates to replace the electrical connector.

2. The testing device of claim 1, wherein the connection points electrically traversing a printed circuit board including the electrical connector.

3. The testing device of claim 1, wherein the resistance being measured is of resistance across the connection points and includes contact area and the insulating coating.

4. The testing device of claim 1, wherein the insulating coating is a ceramic or polymer composition.

5. The testing device of claim 1, wherein the threshold monitor includes a database of electrical characteristics of wear of electrical connectors.

6. The testing device of claim 1, wherein the electrical connector includes a multilayered structure of a copper layer, nickel layer, and gold layer.

7. The testing device of claim 1, wherein the thickness of the insulating coating is at a thickness that wears off at a plug cycle count lower that what is needed to cause damage to the layer of metallic material immediately below the insulating coating.

8. A method for automated electrical connector wear indication during a hardware test comprising:

measuring a resistance across connection points which electrically includes an electrical connector, wherein the electrical connector includes an insulating coating along a contact area mating with the electrical connector and a multilayered structure of at least two layers of metallic materials with different resistances, wherein one of the layer of metallic materials is immediately below the insulating coating and the thickness and type of insulating coating is correlated to be consistent with the laver of metallic material immediately below the insulating coating;

determining when a change in the resistance exceeds a threshold for contact resistance;

and triggering a warning indicator in response to the resistance exceeding the threshold.

9. The method of claim 8, further comprising replacing the connector having the resistance exceeding the threshold.

10. The method of claim 8, wherein the connection points electrically traversing a printed circuit board including the electrical connector.

11. The method of claim 8, wherein the resistance being measured is of resistance across the connection points and includes contact area and the insulating coating.

12. The method of claim 8, wherein the insulating coating is a ceramic or polymer composition.

13. The method of claim 8, wherein a threshold monitor for determining when the change in the resistance exceeds the threshold includes a database of electrical characteristics of wear of electrical connectors.

14. The method of claim 8, wherein the electrical connector includes a multilayered structure of a copper layer, nickel layer, and gold layer.

15. A computer program product for electrical connector wear monitoring, the computer program product can include a non-transitory computer readable storage medium having computer readable program code embodied therewith, the computer readable program code executable by a hardware processor to cause the processor to:

implement, using the hardware processor, measure, using the hardware processor, a resistance across connection points that electrically includes an electrical connector, wherein the electrical connector includes an insulating coating along a contact area mating with the electrical connector and a multilayered structure of at least two layers of metallic materials with different resistances, wherein one of the layers of metallic materials is immediately below the insulating coating and the thickness and type of insulating coating is correlated to be consistent with the layer of metallic material immediately below the insulating coating;

determine, using the hardware processor, when the resistance exceeds a threshold for contact resistance; and trigger, using the hardware processor, a warning indicator to replace the connector in response to the resistance exceeding the threshold.

16. The computer program product for electrical connector wear monitoring of claim 15 further comprising replacing the connector having the resistance exceeding the threshold.

17. The computer program product for electrical connector wear monitoring of claim 15, wherein the connection points electrically traversing a printed circuit board including the electrical connector.

18. The computer program product for electrical connector wear monitoring of claim 15, wherein the resistance being measured is of resistance across the connection points and includes contact area and the insulating coating.

* * * * *